(12) United States Patent
Ohhashi et al.

(10) Patent No.: US 8,908,380 B2
(45) Date of Patent: Dec. 9, 2014

(54) ELECTRICAL CONTROL UNIT

(75) Inventors: Hironori Ohhashi, Isesaki (JP); Takayuki Fukuzawa, Isesaki (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 255 days.

(21) Appl. No.: 13/306,569

(22) Filed: Nov. 29, 2011

(65) Prior Publication Data

US 2012/0320544 A1 Dec. 20, 2012

(30) Foreign Application Priority Data

Jun. 17, 2011 (JP) .................................. 2011-134740

(51) Int. Cl.
*H05K 5/00* (2006.01)
*H05K 5/06* (2006.01)

(52) U.S. Cl.
CPC .............. *H05K 5/0052* (2013.01); *H05K 5/062* (2013.01); *H05K 5/006* (2013.01)
USPC ............ 361/752; 174/535; 174/536; 174/539

(58) Field of Classification Search
USPC ......... 361/752, 622, 651, 714, 719, 730, 736, 361/748, 753, 796, 800; 174/520, 521, 526, 174/535, 536, 539, 540, 50.5, 50.51, 50.57, 174/50.58, 559–564, 668, 669, 256, 259, 174/267, 77 R; 257/704
See application file for complete search history.

(56) References Cited

U.S. PATENT DOCUMENTS

| | | | |
|---|---|---|---|
| 6,407,925 B1 * | 6/2002 | Kobayashi et al. | 361/752 |
| 7,561,435 B2 * | 7/2009 | Kamoshida et al. | 361/752 |
| 8,305,763 B2 * | 11/2012 | Kato | 361/752 |
| 2010/0103632 A1 * | 4/2010 | Kato | 361/752 |

FOREIGN PATENT DOCUMENTS

| | | |
|---|---|---|
| JP | 2001-085858 A | 3/2001 |
| JP | 2003-258451 A | 9/2003 |
| JP | 2009-071764 A | 4/2009 |
| JP | 2009-077211 A | 4/2009 |
| JP | 2010-056493 A | 3/2010 |
| JP | 2010-103447 A | 5/2010 |
| JP | 2011-031696 A | 2/2011 |

* cited by examiner

*Primary Examiner* — Lisa Lea Edmonds
*Assistant Examiner* — Christopher L Augustin
(74) *Attorney, Agent, or Firm* — Foley & Lardner LLP

(57) ABSTRACT

An electrical control unit comprises a case having a groove on a first contact surface thereof, a cover having a protrusion on a second contact surface thereof, a printed wiring board received in a board receiving space defined between the case and the cover, and an adhesive received in the groove, wherein when the cover is put on the case having the protrusion inserted into the groove, the adhesive in a still soft condition is forced to move toward a space between the first and second contact surfaces for bonding the same, and wherein when the printed wiring board is properly put in the board receiving space, a peripheral outer surface of the board serves as an extra part of an inside wall of the groove.

13 Claims, 10 Drawing Sheets

ELECTRICAL CONTROL UNIT

BACKGROUND OF THE INVENTION

1. Field of the Invention

The present invention relates in general to electrical control units and more particularly to the electrical control units of a compact type that is neatly and compactly mounted on a motor vehicle to control operation of an engine, brake and the like.

2. Description of the Related Art

In order to clarify the present invention, one known electrical control unit will be briefly discussed, which is disclosed in Japanese Laid-open Patent Application (tokkai) 2010-56493.

The electrical control unit of the Laid-open Patent Application has an improved sealing effected between a case and a cover for protecting a printed wiring board in the case from water and dust. That is, the case is formed with an endless groove around a mouth part of the case, and the cover is formed with an endless protrusion around a peripheral fringe of the cover. For the sealing, a suitable adhesive is applied into the endless groove and then the endless protrusion is press-fitted into the endless groove. Once the adhesive becomes cured, improved sealing is made between the case and cover.

SUMMARY OF THE INVENTION

However, due to an inherent construction of the endless groove formed in the case, a not-small distance is needed between the endless groove and the printed wiring board, which suppresses the case and thus the entire construction of the electrical control unit from having a sufficiently compact size.

Accordingly, it is an object of the present invention to provide an electrical control unit which is compact in size while assuring a sealing between a case and a cover.

In accordance with a first aspect of the present invention, there is provided an electrical control unit which comprises a first member (12) having a sealing groove (30) on a first contact surface thereof; a second member (13) having a protrusion (25) on a second contact surface thereof, the protrusion being put in the groove of the first member when the second member (13) is properly put on the first member (12) to define therebetween a board receiving space; a printed wiring board (11) received in the board receiving space, the printed wiring board having an electronic part (14) mounted thereon; and a sealing material (20) received in the groove (30), the sealing material being pushed away from the groove to a space between the first and second contact surfaces for bonding the first and second contact surfaces when the protrusion is inserted into the groove while pressing the sealing material, wherein the groove comprises inner and outer side walls (31, 32) that are connected through a rounded bottom wall, a height of the inner side wall being smaller than that of the outer side wall, and wherein a peripheral edge portion of the printed wiring board is put on a top of the inner side wall in a manner to serve as an extra part of the inner side wall.

In accordance with a second aspect of the present invention, there is provided an electrical control unit which comprises a first member (12) having a first contact surface on which a groove (30) is provided; a second member (13) having a second contact surface on which a protrusion (25) is provided, the protrusion being put in the groove of the first member when the second member is coupled with the first member to define therebetween a board receiving space; a printed wiring board (11) received in the board receiving space, the printed wiring board having an electronic part (14) mounted thereon; and an adhesive (20) received in the groove (30), the adhesive (20) in a still soft condition being pushed away from the groove (30) to a space between the first and second contact surfaces for bonding the first and second contact surfaces when the protrusion (25) is inserted into adhesive (20) in the groove (30), wherein the groove (30) includes an outer side wall (32) and an inner side wall (31) of which height is smaller than that of the outer side wall (32), and wherein a peripheral portion of the printed wiring board (11) is put on a top of the inner side wall (31) in a manner to serve as an extra part of the inner side wall (31).

In accordance with a third aspect of the present invention, there is provided an electrical control unit which comprises a case (12) having a first contact surface on which an endless groove (30) is provided, the endless groove (30) including inner and outer side walls (31, 32) of the case, a height of the inner side wall (31) being smaller than that of the outer side wall (32); a cover (13) having a second contact surface on which an endless protrusion (25) is provided, the endless protrusion being put in the groove of the case when the cover is coupled with the case to defined therebetween a board receiving space; a printed wiring board (11) received in the board receiving space, the printed wiring board having an electronic part (14) mounted thereon; an adhesive (20) received in the groove (30), the adhesive in a still soft condition being pushed away from the groove (30) to a space between the first and second contact surfaces for bonding the first and second contact surfaces when the endless protrusion (25) is inserted into the groove (30) while pushing away the adhesive (20); raised portions (31a, 46) formed on given portions of the top of the inner side wall (31) to put thereon a peripheral edge portion of the printed wiring board, wherein the pushed away adhesive fills a second space (L2) defined between a top of the outer side wall (32) and the second contact surface (26), a third space (L3) defined between an upper surface of the peripheral portion of the printed wiring board (11) and the second contact surface (26) and a seventh space (L7) defined between a lower surface of the peripheral portion of the printed wiring board (11) and a top of the inner side wall (31).

BRIEF DESCRIPTION OF THE DRAWINGS

Other objects and advantages of the present invention will become apparent from the following description when taken in conjunction with the accompanying drawings, in which.

DETAILED DESCRIPTION OF THE EMBODIMENTS

In the following, embodiments of an electrical control unit of the present invention will be described in detail with reference to the accompanying drawings.

The electrical control unit that will be explained in the following is a controller for controlling an engine of a motor vehicle.

Referring to FIGS. 1 to 8, there is shown an electrical control unit of a first embodiment of the present invention.

Figure 3:
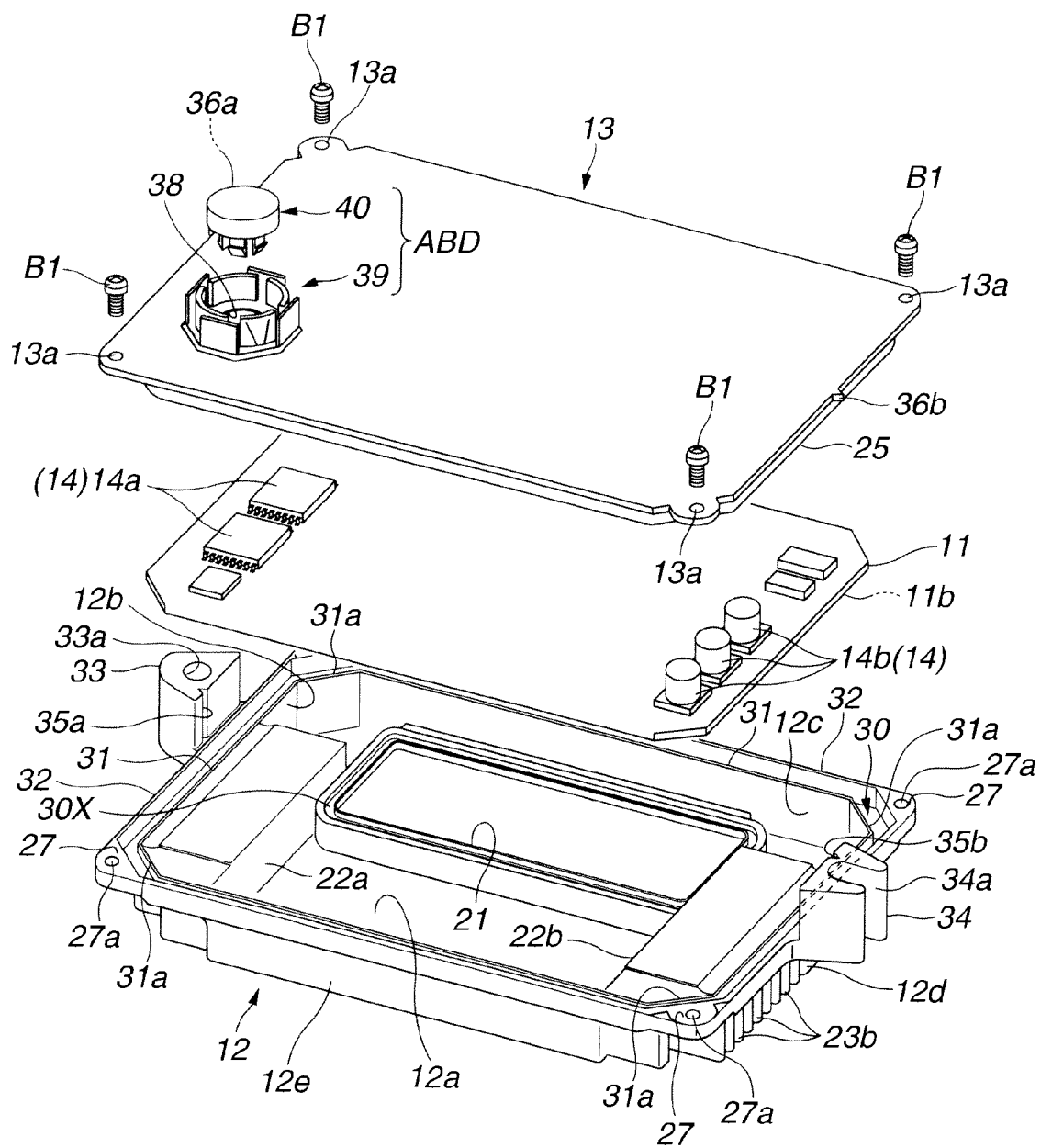
FIG. 3 is an exploded view of the electrical control unit of the first embodiment of the present invention.

As is well understood from FIG. 3, the electrical control unit generally comprises a printed wiring board 11 that is equipped at its upper and lower surfaces with various electronic parts 14 such as condensers, coils, transistors, ICs (viz., integrated circuits) and the like, a case 12 that has a recess slightly larger than printed wiring board 11 and tightly installs therein printed wiring board 11 and a cover 13 that is connected to a mouth portion of case 12 to cover the recess of case 12 through a plurality of connecting screws B1. Although not shown, electrical control unit is mounted in an engine room of a motor vehicle.

Printed wiring board 11 comprises a plate member (no numeral) that is made of an electrically insulated material, for example, a glass-reinforced epoxy resin or the like, wiring patterns "PT" that are printed on both surfaces of the plate member or arranged in the plate member (see FIG. 6), and various electronic parts 14 that are connected to wiring patterns "PT" by soldering.

As is seen from FIGS. 4 to 7 and as will be described in detail hereinafter, printed wiring board 11 has a peripheral portion that is put on a top of an inner side wall 31 of an endless (or rectangular) groove 30 formed on a rectangular fringe portion of case 12, and the peripheral portion of the board 11 is tightly bonded to the top of inner side wall 31 through an adhesive 20 applied to endless groove 30.

In the description, the adhesive 20 is sometimes explained as a sealing material because it has sealing function as well as bonding function.

Figure 6:
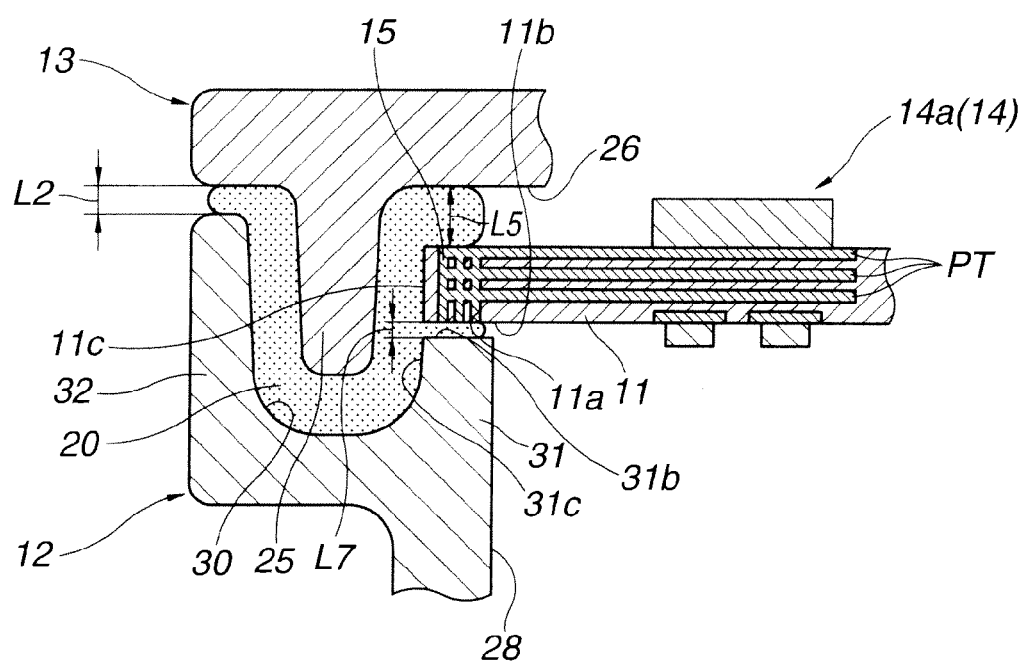
FIG. 6 is an enlarged sectional view taken along the line C-C of FIG. 1.

As is seen from FIG. 6, printed wiring board 11 is formed, at a peripheral portion thereof where high heat generating parts 14a are arranged, with a plurality of through holes 11b filled with a thermal-conductivity material 15 such as solder and the like, and thermal-conductivity material 15 is connected to wiring patterns "PT" that are connected to high heat generating parts 14a arranged in the printed wiring board 11. With this arrangement, the heat generated by high heat generating parts 14a is adequately dissipated to the outside through wiring patterns "PT" and thermal-conductivity material 15.

It is to be noted that it is not necessary to fill all of through holes 11b arranged near high heat generating parts 14a with thermal-conductivity material 15. In this case, through holes 11b having no thermal-conductivity material 15 filled therein may be filled with adhesive 20. That is, heat radiation from high heat generating parts 14a may be carried out through adhesive 20.

Figure 2:
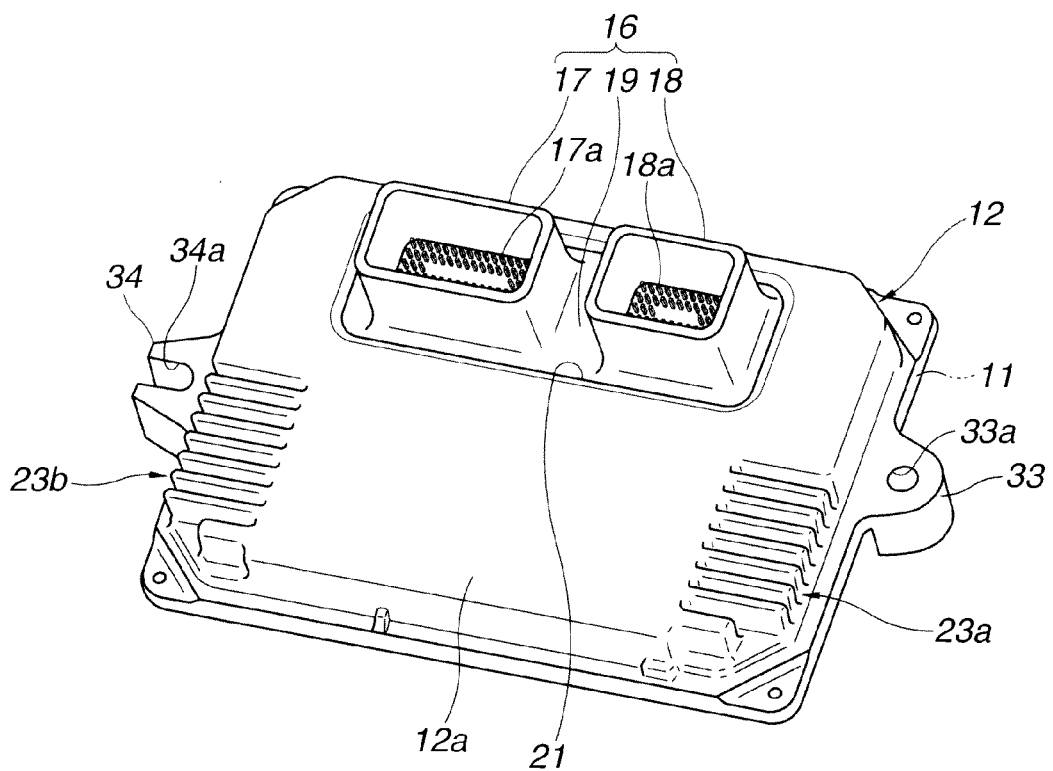
FIG. 2 is a perspective view of the electrical control unit of the first embodiment, showing a back view of the unit.

As is understood from FIGS. 2 and 3, printed wiring board 11 is provided at its back surface 11b facing case 12 with a connector unit 16 that comprises first and second connecting mouths 17 and 18 that are integrally connected to each other through a mounting base 19. Connector unit 16 is connected to printed wiring board 11 through connecting screws (not shown).

As is seen from FIG. 2 and will become apparent as the description proceeds, connector unit 16 is projected outward from a rectangular opening 21 formed in a bottom wall 12a of case 12, and when in use, connector unit 16 is connected to a partner connector (not shown).

As is seen from FIG. 2, within first and second connecting mouths 17 and 18, there are respectively installed first and second groups of male terminals 17a and 18a, as shown. These male terminals 17a and 18a are connected to the above-mentioned wiring patterns "PT" (see FIG. 6). Upon coupling of connector unit 16 with the partner connector, male terminals 17a and 18a are brought into connection with female terminals (not shown) of the partner connector to connect the wiring patterns "PT" to predetermined electric devices, such as sensors, pump and the like, which are connected to the female terminals of the partner connector.

As is seen from FIGS. 2 and 3, case 12 is constructed of a heat dissipating metal such as aluminum or the like and shaped rectangular.

That is, as is seen from FIG. 3, case 12 comprises a rectangular bottom wall 12a and first, second, third and fourth side walls 12b, 12c, 12d and 12e that are respectively raised from four sides of bottom wall 12a to constitute a rectangular receptacle member.

As is mentioned hereinabove, rectangular bottom wall 12a is formed with the rectangular opening 21 (or window) through which the two connecting mouths 17 and 18 of connector unit 16 project outward as is seen from FIG. 2. As is seen from FIG. 2, upon assembly, the two connecting mouths 17 and 18 project outward from the electrical control unit.

As is seen from FIG. 3, rectangular bottom wall 12a is formed at longitudinally opposed portions thereof with first and second heat sink projections 22a and 22b that function to effectively radiate the heat generated by high heat generating parts 14a and the heat generated by heat generating parts 14b mounted on printed wiring board 11.

As is seen from the drawing, first and second heat sink projections 22a and 22b are placed to contact the parts 14a and 14b respectively. Although now shown in the drawing, known heat radiation sheets and heat radiation grease are put on first and second heat sink projections 22a and 22b for effective heat transfer from the parts 14a and 14b to the heat sink projections 22a and 22b.

As is seen from FIG. 2, bottom wall 12a of case 12 is formed at its outer surface with first and second heat radiation fins 23a and 23b for promoting the heat radiation from first and second heat sink projections 22a and 22b to the outside. More specifically, first and second heat radiation fins 23a and 23b are formed on bottom walls of first and second heat sink projections 22a and 22b respectively.

As is understood from FIG. 3, on tops of the four side walls 12b, 12c, 12d and 12e, there is integrally formed the above-mentioned rectangular fringe portion of case 12, and the endless groove 30 extends along the rectangular fringe portion. Into groove 30, there is applied adhesive 20 for tightly bonding the peripheral portion of printed wiring board 11 to the rectangular fringe portion, as has been mentioned hereinabove.

As will be described in detail hereinafter, a rectangular protrusion 25 projected from cover 13 is inserted into endless groove 30 squashing or getting into a still soft adhesive 20 in groove 30. Thus, once adhesive 20 is cured, case 12 and cover 13 are hermetically and tightly bonded to each other.

As is seen from FIG. 4, when, for bonding cover 13 to case 12, cover 13 is put on case 12 with the still soft adhesive 20 kept in groove 30, there are formed first and second spaces "L1" and "L2" between a contact surface 24 of case 12 and a contact surface 26 of cover 13, and as will be described in detail hereinlater, as endless rectangular protrusion 25 of cover 13 squashes or gets into the still soft adhesive 20, the adhesive 20 is forced to run into first space "L1" (more specifically, after-mentioned spaces "L5" and "L7") and second space "L2", as shown. With this, the two spaces "L1" and "L2" become filled with still soft adhesive 20. It is to be noted that filling second space "L2" with the still soft adhesive 20 prevents second space "L2" from collecting or holding water therein and thus prevents to case 12 and cover 13 from having rust particularly at portions facing second space "L2".

It is to be noted that adhesive 20 is of a known type that exhibits a certain fluidity before its curing. Examples of adhesive 20 are epoxy adhesive, silicon adhesive, acrylic adhesive and the like.

Figure 4:
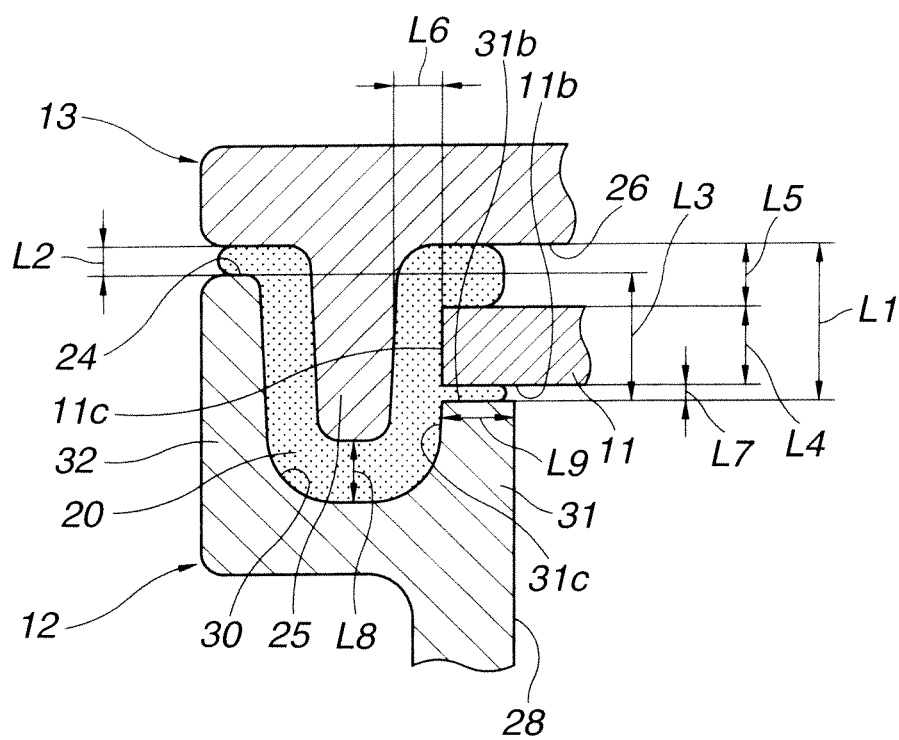
FIG. 4 is an enlarged sectional view taken along the line A-A of FIG. 1.
Figure 5:
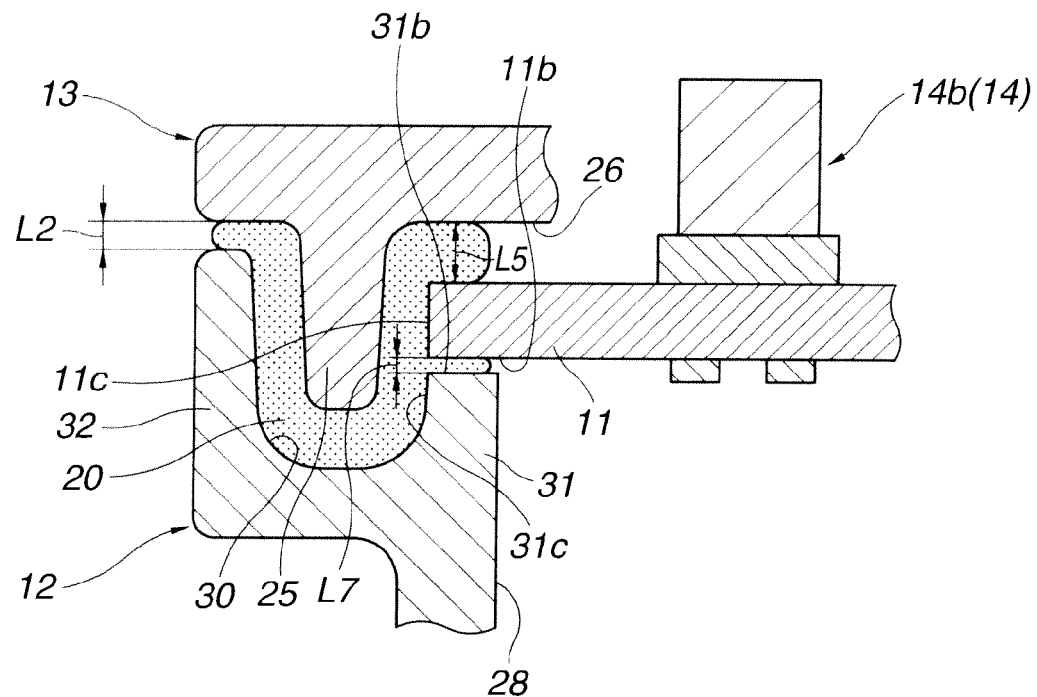
FIG. 5 is an enlarged sectional view taken along the line B-B of FIG. 1.

As is seen from FIG. 4, groove 30 is defined by an inner side wall 31, an outer side wall 32 and a rounded bottom wall (no numeral) through which bottom portions of inner and outer side walls 31 and 32 are integrally connected.

It is to be noted that the height of inner side wall 31 is smaller than that of outer side wall 32 by a given length "L3" (=L1−L2).

Figure 7:
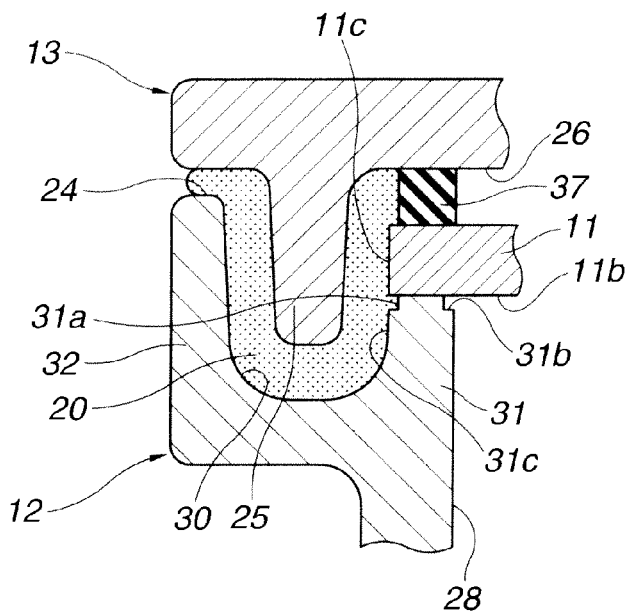
FIG. 7 is an enlarged sectional view taken along the line D-D of FIG. 1.

As will be understood from FIGS. 3 and 7, once electrical control unit is finally assembled, on projected seat portions 31a formed on four corner portions of lower inner side wall 31, there are placed four corner portions of rectangular printed wiring board 11, and at the same time, as is seen from FIG. 4, a space "L7" defined between the peripheral part of printed wiring board 11 and the top 31b of the inner side wall 31 and the other space "L5" between the peripheral part of printed wiring board 11 and contact surface 26 of cover 13 are both filled with a certain amount of cured adhesive 20.

While, the height of the higher outer side wall 32 is set to match the maximum tolerance in dimension of case 12 and cover 13, and thus, even when the dimensional error of case 12 and cover 13 shows the maximum, direct contact between contact surface 24 of case 12 and contact surface 26 of cover 13 never occurs.

Furthermore, in this embodiment, the length "L3" is sufficiently large as compared with the thickness "L4" of printed wiring board 11, and thus, the inside space "L5" defined between printed wiring board 11 and cover 13 is larger than the outside space "L2" defined between outer side wall 32 and cover 13. That is, with the larger inside space "L5", the space "L5" is permitted to hold therein a larger amount of the still soft adhesive 20. The larger inside space "L5" serves as a seal material holding space in the first embodiment of the present invention.

It is to be noted that in addition to the needed relation "L5>L2", the ratio between "L5" and "L2" is so determined that squashing or pushing of the rectangular protrusion 25 of cover 13 against the still soft adhesive 20 does not induce a leakage or spillage of the adhesive 20 from spaces "L5" and "L2" into inside and outside of case 12. Of course, for fulfilling the above, the thickness of each of inner and outer side walls 31 and 32 should be considered.

It is to be noted that the leakage or spillage of adhesive 20 does not mean that adhesive 20 does not completely leak or spill from spaces "L5" and "L2". In other words, it means that adhesive 20 is suppressed from flowing down from spaces "L5" and "L2". More specifically, if the leakage of adhesive 20 to the outside of case 12 is so made as not to substantially spoil a subsequent workability, such leakage is permitted, and if the leakage of adhesive to the inside of case 12 is so made as not to spoil operation of electric parts mounted on printed wiring board 11, such leakage is also permitted.

In addition to the above-mentioned needed relation "L5>L2", as is seen from FIG. 4, upon assembly, an inside surface 31c of inner side wall 31 of groove and an outer peripheral surface 11c of printed wiring board 11 constitute an imaginary common plane and the outer peripheral surface 11c serves as a part of inside surface 31c of inner side wall 31.

It is now to be noted that a space "L6" defined between the outer peripheral surface 11c of the board 11 and projected protrusion 25 of cover 13 is set larger than a space "L7" defined between a back surface 11b and projected seat portion 31a of inner side wall 31. Actually, the space "L7" servers as a tolerance absorbing space. In other words, if the relation "L6>L7" is established, the common plain arrangement between outer peripheral surface 11c of printed wiring board 11 and inside surface 31c of inner side wall 31 is not always necessary. That is, if the relation is established, outer peripheral surface 11c may project outward beyond inside surface 31c or outer peripheral surface 11c may draw back behind inside surface 31c.

The space "L7" is means for absorbing a production tolerance of printed wiring board 11 and case 12. That is, the relation "L6>L7" is provided for absorbing the production tolerance of printed wiring board 11, case 12 and cover 13.

In the electrical control unit having the above-mentioned construction, an arrangement is made wherein the peripheral edge portion of printed wiring board 11 is surrounded by a still soft adhesive 20 that extends in and along the endless groove 30, and due to function of the adhesive 20, the board 11 is bonded to case 12.

It is to be noted that the above-mentioned bonding technique is also applied to a bonding between connector unit 16 (see FIG. 2) provided on the back surface of printed wiring board 11 and a groove 30x (see FIG. 3) provided by the rectangular opening 21 of case 12. As shown in FIG. 3, groove 30x is formed in a top of a rectangular projection (no numeral) by which the rectangular opening (or window) 21 is defined. That is, upon assembly, a rectangular wall (not shown) raised from connector 16 is projected into the groove 30x squashing or getting into still soft adhesive in the groove 30x.

Figure 1:
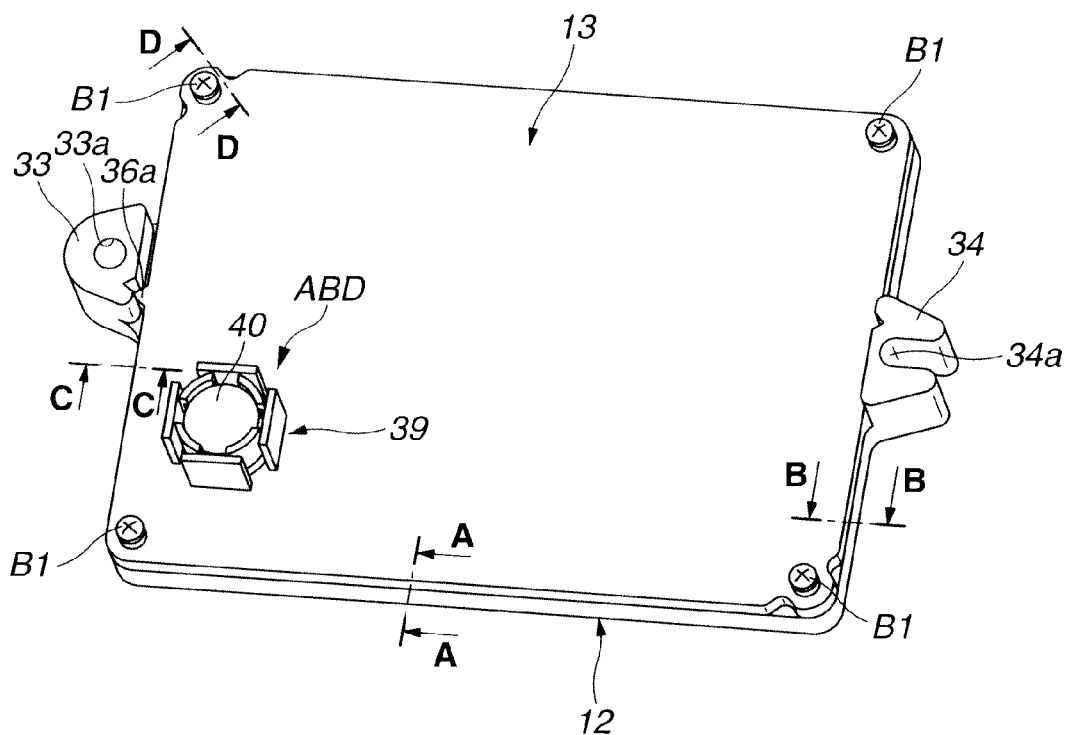
FIG. 1 is a perspective view of an electrical control unit of a first embodiment of the present invention, showing a front view of the unit.

As is seen from FIGS. 1 to 3, first and third side walls 12b and 12d of case 12 are integrally formed with first and second brackets 33 and 34 respectively. These brackets 33 and 34 are used when the electrical control unit is mounted to a given position of a vehicle.

First bracket 33 is formed with a through bore 33a, and second bracket 34 is formed with a round groove 34a. The mounting of the electric control unit to the vehicle is made with the aid of through bore 33a and round groove 34a. If desired, first and second brackets 33 and 34 may be separate parts that are connected to case 12 through welding, connecting screws or the like.

As is seen from FIGS. 1 and 3, first and second brackets 33 and 34 are respectively formed with first and second engaging grooves 35a and 35b that are engageable with first and second projections 36a and 36b formed on axially opposed portions of cover 13. It is to be noted that first and second engaging grooves 35a and 35b are so constructed and designed as to engage with only first and second projections 36a and 36b. That is, for example, second engaging groove 35b can not properly engage with first projection 36a. Such arrangement facilitates the coupling between case 12 and cover 13.

Cover 13 is constructed of a heat dissipating metal like in case of the case 12 and shaped substantially flat as shown. As shown in FIGS. 1 and 3, cover 13 has at four corners thereof screw through openings 13a through which the above-mentioned connecting screws B1 pass to engage with after-mentioned threaded openings 27a of case 12. With this, cover 13 is tightly fixed to case 12.

As is understood from FIG. 3, the four corners of cover 13 are respectively put on mount faces 27 formed at four corners of case 12. Each mount face 27 is higher than the above-mentioned outer side wall 32 of groove 30, and each mount face 27 has the threaded opening 27a formed therethrough.

Due to the positional relation between the four corners of to cover 13 and the four mount faces 27 of case 12, the above-mentioned first and second spaces "L1", "L2" and "L8" (see FIG. 4) are defined.

As will be understood from FIG. 7, four elastic members 37 constructed of rubber or the like are put and pressed between the four corners of printed wiring board 11 and the four corners of cover 13. As shown, each elastic member 37 is positioned inside rectangular protrusion 25 of cover 13. Due to work of elastic members 37, printed wiring board 11 is resiliently and stably supported on projected seat portions 31a of case 12. With this arrangement, the above-mentioned space "L5" is assuredly made.

Furthermore, since elastic members 37 are positioned at the corners of cover 13, the parts-mounting zone provided by printed wiring board 11 is not so reduced. That is, provision of such elastic members 37 does not induce reduction of parts-mounting space provided by the electrical control unit. If elastic members 37 are arranged at positions other than the above-mentioned four corners of cover 13, it becomes impossible to avoid upsizing of printed wiring board 11 because of need of elastic member supporting area by the board 11.

If desired, in place of the four elastic members 37, a rectangular elastic member may be used. In this case, as will be understood from FIG. 7, undesired leakage or spillage of the still soft adhesive 20 toward a printed wiring board containing space 28 can be assuredly suppressed. Of course, in this case, various electronic parts 14 on printed wiring board 11 are assuredly protected from invasion of such adhesive 20.

Referring back to FIG. 3, cover 13 is provided with an air breathing device (breather) "ABD" that functions to adjust a pressure difference between the inside and outside of the electric control unit.

As is seen from FIG. 3, air breathing device ABD comprises a circular opening 38 formed in a major part of cover 13, wall pieces 39 formed on cover 13 in a manner to surround circular opening 38, and a circular filter member 40 detachably connected to wall pieces 39 in a manner to cover circular opening 38. With provision of wall pieces 39, undesired water invasion into the interior of electrical control unit is suppressed.

In the following, steps for assembling the electric control unit will be described with the aid of the drawings, particularly FIGS. 3 and 8.

First, case 12 is set on a given work position with its open side facing upward, and known heat radiation sheets and heat radiation grease are applied to first and second heat sink projections 22a and 22b of case 12, and connector unit 16 (see FIG. 2) is fixed to printed wiring board 11 by connecting screws.

Then, adhesive 20 in a still soft condition is applied to the endless groove 30 of case 12. If desired, as seen from FIG. 8, such adhesive 20 may be applied to projected seat portions 31a provided at four corners of lower inner side wall 31 of case 12, as is shown by a phantom line. By applying adhesive to projected seat portions 31a in addition to groove 30, adhesive is assuredly led into the tolerance absorbing space "L7" as is understood from the right part of FIG. 8, which allows not only a tight bonding of printed wiring board 11 to a given portion of case 12 in a later step, but also improvement in heat dissipation from high heat generating parts 14a on printed wiring board 11. That is, by assuredly feeding adhesive 20 to the space "L7" and curing the same, heat of printed wiring board 11 caused by heat generation by heat generating parts 14a can be effectively conducted to case 12 through the cured adhesive 20. That is, improved heat dissipation from high heat generating parts 14a is carried out from such assured adhesive feeding.

Since adhesive 20 is also placed between printed wiring board 11 and cover 13, sufficient heat dissipation is also carried out from the side of cover 13.

Then, printed wiring board 11 is brought onto case 12 while inserting connector unit 16 into rectangular opening 21 of case 12 and the board 11 is so positioned that outer peripheral surface 11c (see FIG. 4) of board 11 is flat with inside surface 31c of inner side wall 31 of case 12. With these steps, printed wiring board 11 is properly put on the four projected seat portions 31a of the lower inner side wall 31 of case 12, as is seen from FIG. 4.

Then, cover 13 is brought onto case 12 having rectangular protrusion 25 thereof inserted into rectangular groove 30 of case 12. For a proper setting of cover 13 onto case 12, first and second projections 36a and 36b of cover 13 engage with and slide along first and second engaging grooves 35a and 35b of case 12 respectively. During this, rectangular protrusion 25 gradually gets into the still soft adhesive 20 held in groove 30.

Figure 8:
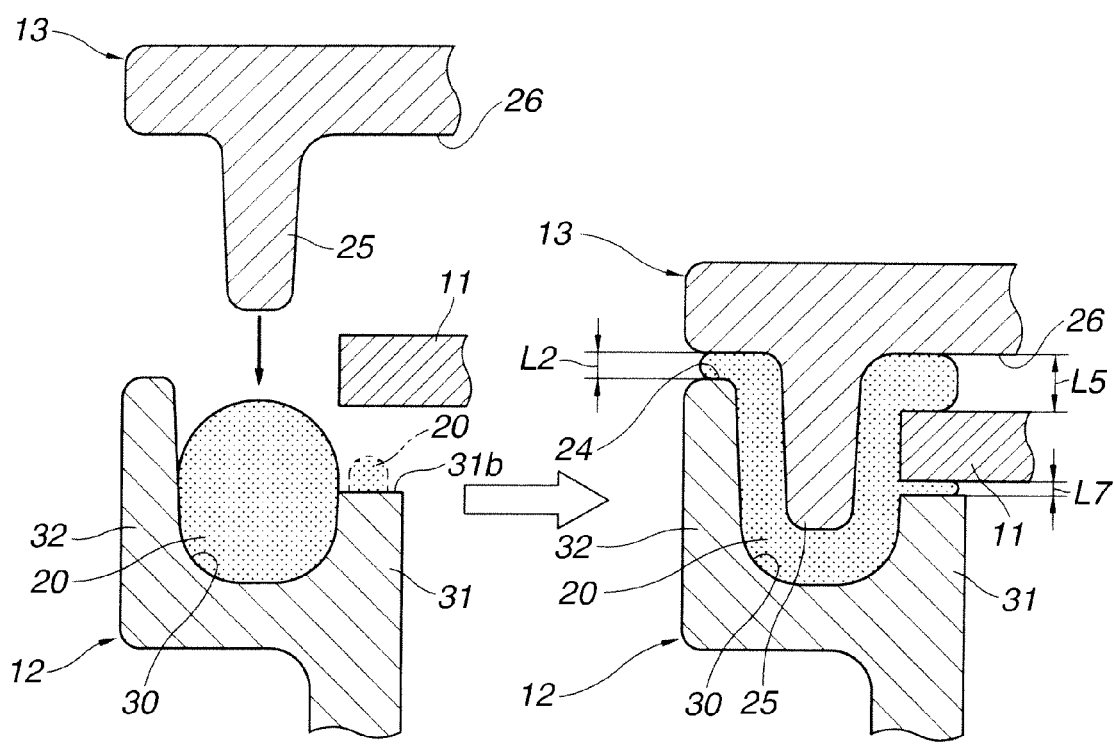
FIG. 8 is a sketch depicting movement of an adhesive, that appears when a cover is about to be fitted to a case.

As is seen from FIG. 8, during downward movement of rectangular protrusion 25 of cover 13, the still soft adhesive 20 is forced to change its shape causing parts thereof to move into spaces "L2", "L5" and "L7", as shown. With this, the spaces "L2", "L5" and "L7" are each filled with adhesive 20. Thus, not only a space between groove 30 and rectangular protrusion 25 but also a space between contact surface 24 of case 12 and the other contact surface of cover 13 is hermetically sealed, which increases the length of sealing portion between case 12 and cover 13 assuring the sealing therebetween.

Since space "L5" is larger than space "L2", upon insertion of protrusion 25 into groove 30, a larger amount of adhesive 20 is led toward the space "L5", and thus the peripheral portion of printed wiring board 11 is entirely covered with the still soft adhesive 20, as will be understood from FIG. 8. With this, contact surface between printed wiring board 11 and adhesive is increased and thus, the board 11 is assuredly bonded to case 12 and cover 13. This feature is superior to a known method in which the board (11) is connected to case (12) through connecting screws. Furthermore, due to usage of adhesive 20, heat dissipation from high heat generating parts 14a on printed wiring board 11 is effectively carried out.

Furthermore, due to provision of the larger space "L5", a so-called seal material holding space is defined by the space "L5". Thus, even when the amount of the still soft adhesive 20, which is pushed out from groove 30 due to insertion of protrusion 25 into groove 30, is relatively large, the seal material holding space (viz., "L5") sufficiently holds the pushed out part of adhesive 20, which prevents undesired leakage or spillage of the still soft adhesive 20 into the inside and outside of case 12. That is, since space "L2" is relatively small, the pushed still soft adhesive 20 is forced to flow toward the larger space "L5", and thus, leakage of the still soft adhesive 20 to the outside of case 12 is suppressed or at least minimized, and due to the relatively large volume possessed by space "L5", leakage of adhesive 20 to the inside of case 12 is also suppressed or at least minimized.

If the ratio between space "L2" and space "L5" is suitably adjusted, it is possible to neatly fill space "L2" with adhesive 20 without inducing undesired leakage of adhesive 20 to the outside of case 12. In this case, case 12 and cover 13 are prevented from having rust particularly at portions facing space "L2".

As is seen from FIG. 3, once cover 13 is properly put on case 12 in the above-mentioned manner, these two members 13 and 12 are connected through four connecting screws B1, as shown. When thereafter sufficient curing time passes, adhesive 20 becomes hardened and thus, cover 13 and case 12 are tightly and completely fixed to each other. Upon this, assembly of the electrical control unit is finished.

In the following, advantages of the electrical control unit of the first embodiment of the preset invention described herein above will be itemized.

(1) An outer peripheral surface 11c (see FIG. 4) of printed wiring board 11 is used as part of inner side wall 31 of case 12 for handling the still soft adhesive 20. Thus, it is possible to reduce the size or weight of case 12 by a degree by which the outer peripheral portion of the board 11 serves as part of inner side wall 31. More specifically, if the above-mentioned advantageous technique is not employed, the size or weight of case 12 would increase by a degree represented by the product of length "L9" and the length of the periphery of the board 11.

(2) In the first embodiment of the invention, by making inner side wall 31 lower than outer side wall 32 (see FIG. 4), a larger inside space "L5" is defined. With this, almost all (viz., upper surface, side surface and lower surface) of the peripheral portion of printed wiring board 11 can be covered by adhesive 20. Thus, fixing of the board 11 to case 12 and cover 13 is assuredly made. Thus, there is no need of using connecting screws for effecting such fixing. Thus, in the first embodiment, reduction in number of parts and improvement in workability induced by such parts-number reduction are obtained, which reduces production cost of the electrical control unit. Furthermore, because of no need of providing the board 11 with screw openings, much larger space for mounting electrical parts can be provided by the board 11. Furthermore, because of full covering of adhesive 20 to the peripheral portion of printed wiring board 11, heat dissipation from the board 11 is effectively carried out through case 12 and cover 13. As is mentioned hereinabove, in the first embodiment, printed wiring board 11 is equipped at the peripheral portion thereof with high heat generating parts 14a (see FIG. 3). In this case, heat dissipation from the high heat generating parts 14a is much more effectively carried out.

(3) Space "L6" (see FIG. 4) defined between the outer peripheral surface 11c of printed wiring board 11 and projected protrusion 25 of cover 13 is set larger than a so-called tolerance absorbing space "L7". Thus, once the still soft adhesive 20 is pressed or squashed by protrusion 25 of cover 13, part of adhesive 20 is assuredly pushed up to the inside space "L5". With this, the inside space "L5" is suitably filled with adhesive 20, which brings about a tight bonding between the board 11 and cover 13.

Figure 9:
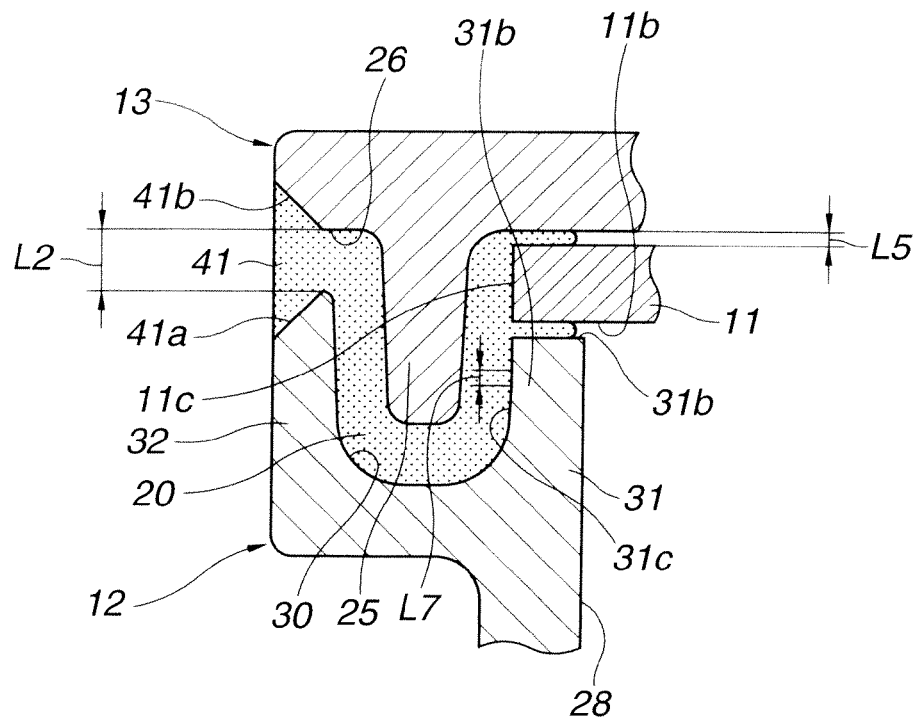
FIG. 9 is a view similar to FIG. 4, but showing a second embodiment of the present invention.

Referring to FIG. 9, there is shown a second embodiment of the present invention.

In this second embodiment, a so-called seal material holding space is provided at an outer side of groove 30, as shown. (In the above-mentioned first embodiment, such holding space "L5" is provided at an inner side of groove 30 as is seen from FIG. 4.)

In the second embodiment, as is seen from FIG. 9, outer side wall 32 of case 12 is formed along a top portion thereof with an outwardly exposed inclined surface 41a that extends around case 12, and the outer periphery of cover 13 is formed therealong with an outwardly exposed inclined surface 41b that extends along cover 32.

When cover 13 is properly put on case 12 with the still soft adhesive 20 kept in groove 30 as shown, the two inclined surfaces 41a and 41b obliquely face each other to define upper and lower outer surfaces of a relatively large seal material holding space 41 that is merged with a major space defined between groove 30 of case 12 and protrusion 25 and cover 13.

In this second embodiment, during insertion of protrusion 25 into groove 30 pushing adhesive 20 away, a flow of still soft adhesive 20 toward the larger seal material holding space 41 is positively carried out. Of course, in this second embodiment, by suitably adjusting the ratio between space "L2" and space "L5", it is possible to neatly fill each of the spaces with the still soft adhesive 20 without inducing undesired leakage of adhesive 20 to the outside and inside of case 12.

Accordingly, in this second embodiment, substantially same operation effects as those of the above-mentioned first embodiment are equally obtained. Particularly, in this second embodiment, the flow of adhesive 20 toward the seal material holding space 41 is positively produced, and thus, the outside space "L2" is filled with a sufficient amount of adhesive 20, and thus, rusting of case 12 and cover 13 particularly portions of them that face space "L2" is suppressed or at least minimized.

Figure 10:
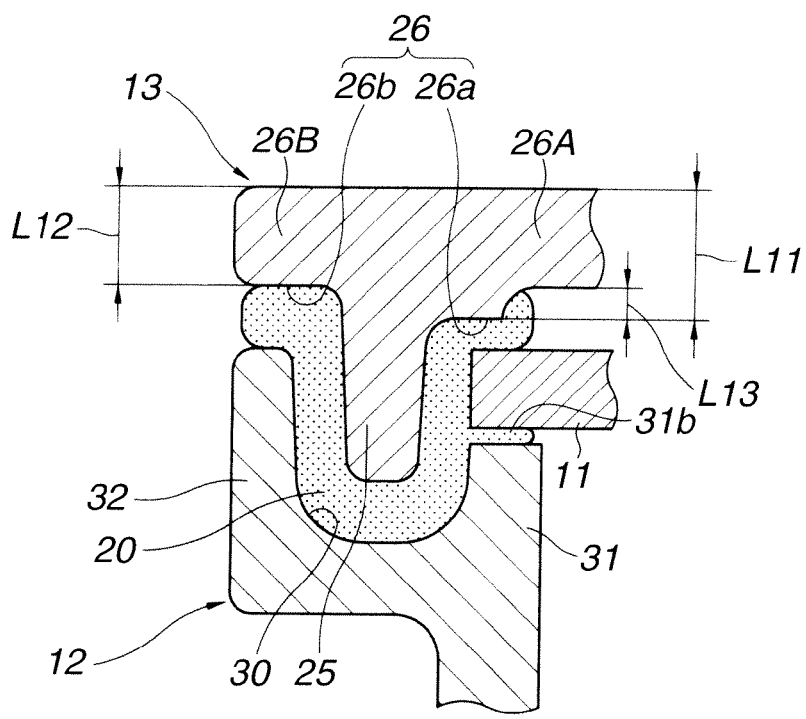
FIG. 10 is a view similar to FIG. 4, but showing a third embodiment of the present invention.

Referring to FIG. 10, there is shown a third embodiment of the present invention.

In this third embodiment, cover 13 has at opposed positions of protrusion 25 first and second portions 26A and 26B that have flat lower surfaces 26a and 26b respectively. As shown, in this third embodiment, the thickness "L11" of first portion 26A is larger than that "L12" of the second portion 26B. That is, first portion 26A is thicker than second portion 26B by "L13".

When cover 13 is properly put on case 12 with the still soft adhesive 20 kept in groove 30 as shown, there is defined, between contact surface 24 of case 12 and contact surface 26b of cover 13a, a relatively large seal material holding space that is merged with a major space defined between groove 30 of case 12 and protrusion 25 of cover 13.

For the reasons mentioned hereinabove, also in this third embodiment, substantially same operation effects as those of the first embodiment are equally obtained. Also, in this third embodiment, the flow of adhesive 20 toward the seal material holding space is positively produced, and thus, the outside space defined by the two contact surfaces 24 and 26b is filled with a sufficient amount of adhesive 20, and thus, rusting of case 12 and cover 13 particularly portions of them that face the outside space is suppressed or at least minimized.

Figure 11:
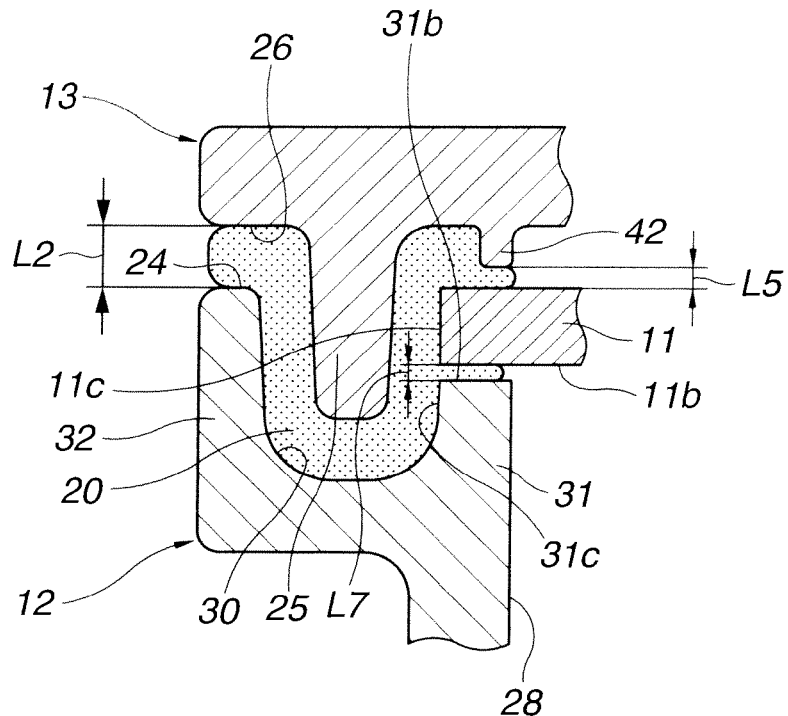
FIG. 11 is a view similar to FIG. 4, but showing a fourth embodiment of the present invention.

Referring to FIG. 11, there is shown a fourth embodiment of the present invention.

In this fourth embodiment, cover 13 has at an inside position of protrusion 25 a shorter protrusion 42 that is directed toward the upper surface of printed wiring board 11 when the three elements 11, 12 and 13 are properly assembled with the still soft adhesive 20 held by the three elements 11, 12 and 13. With this arrangement, the size of space "L5" is reduced.

In this fourth, due to provision of shorter protrusion 42, flow of the still soft adhesive 20 toward the interior of case 12 is obstructed and thus, undesired leakage or spillage of the still soft adhesive 20 into printed wiring board containing space 28 is suppressed or at least minimized.

Figure 12:
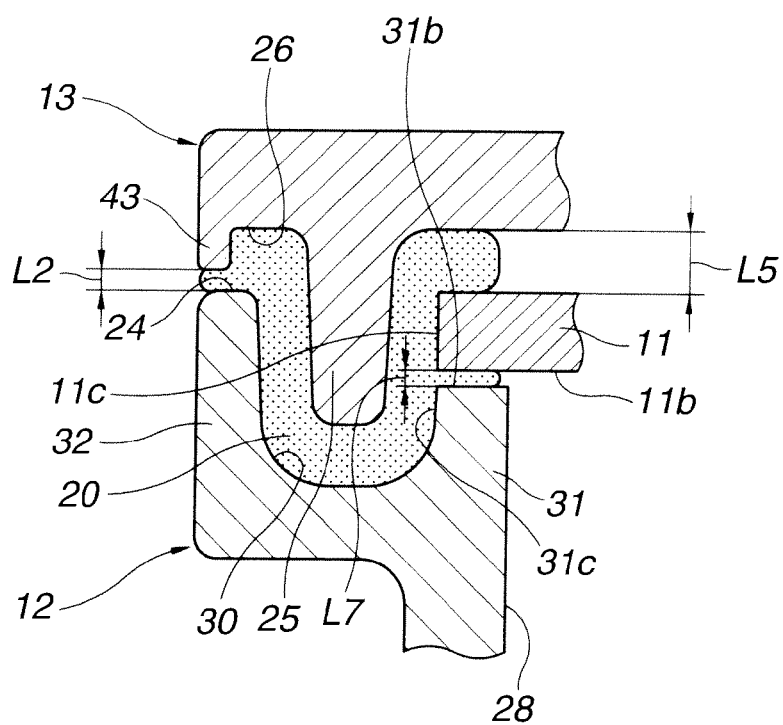
FIG. 12 is a view similar to FIG. 4, but showing a fifth embodiment of the present invention.

Referring to FIG. 12, there is shown a fifth embodiment of the present invention.

In this fifth embodiment, cover 13 has at an outside position of protrusion 25 a shorter protrusion 43 that is directed toward contact surface 24 of case 12 when the three elements 11, 12 and 13 are properly assembled with the still soft adhesive 20 held by the three elements 11, 12 and 13. With this arrangement, the size of space "L2" is reduced.

In this fifth embodiment, due to provision of shorter protrusion 43, flow of the still soft adhesive 20 toward the outside of the unit of case 12 and cover 13 is obstructed and thus, undesired leakage or spillage of the still soft adhesive 20 to the outside of the unit (12, 13) is suppressed or at least minimized.

If desired, for controlling flow of the still soft adhesive 20 to the inside and outside of the unit (12, 13), the above-mentioned shorter protrusions 42 and 43 may be provided at both inside and outside positions of the main protrusion 25.

Figure 13:
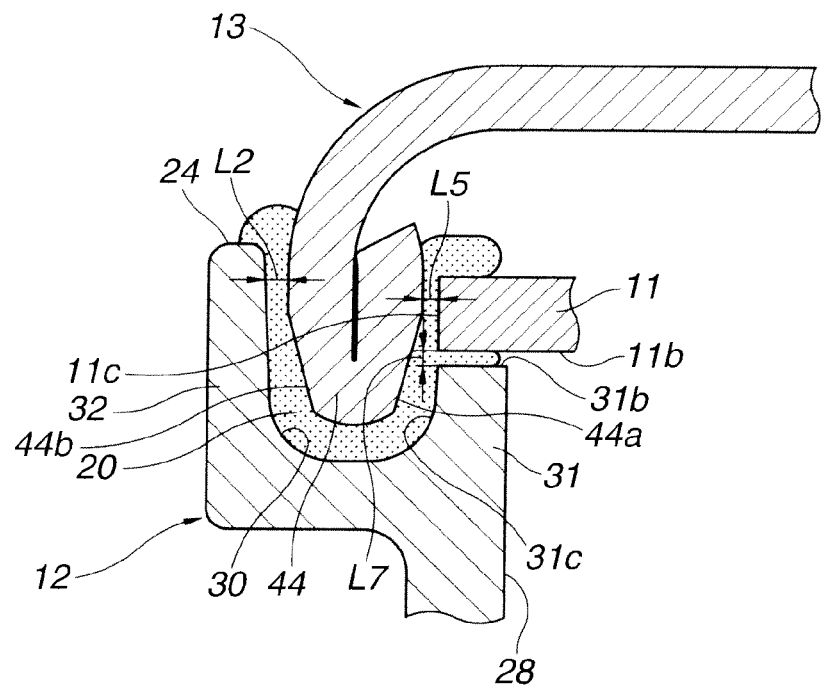
FIG. 13 a view similar to FIG. 4, but showing a sixth embodiment of the present invention.

Referring to FIG. 13, there is shown an electrical control unit of a sixth embodiment of the present invention.

As is seen from the drawing, in this sixth embodiment, cover 13 has a downwardly bent peripheral portion that serves as the above-mentioned protrusion 25 that is to be inserted into endless groove 30 of case 12.

More specifically, in this sixth embodiment, cover 13 is made of a metal sheet and the peripheral portion of cover 13 is sharply bent up inward to form a downwardly directed protrusion portion 44.

As shown, protrusion portion 44 comprises an inclined inner wall 44a and an inclined outer wall 44b that are connected through a rounded lower wall (no numeral). Thus, protrusion portion 44 has a generally V-shaped cross section.

As shown, for assembling the electrical control unit of the sixth embodiment, adhesive 20 is applied into groove 30 of case 12, then printed wiring board 11 is put in case 12 having the four corners of the board 11 put on projected seat portions 31a provided at four corners of lower inner side wall 31 of case 12. Then, cover 13 is brought onto case 12 having protrusion portion 44 thereof inserted into groove 30 of case 12. With this, protrusion portion 44 gradually gets into the still soft adhesive 20 held in groove 30.

During insertion of protrusion portion 44 into groove 30, the still soft adhesive 20 in groove 30 is pushed away causing part thereof to flow through spaces "L2", "L5" and "L7", as shown. Due to a bulged shape of protrusion portion 44, insertion of protrusion portion 44 into groove 30 effectively presses the still soft adhesive 20 against the inner wall of groove 30, which improves adhesion of adhesive 20 to case 12.

If desired, the shape of protrusion portion 44 may change so long as it can effectively press the still soft adhesive 20 against the inner wall of groove 30. One example of the shape of protrusion portion 44 is a rounded shape. Of course, for shaping the protrusion portion 44, various known methods may be used.

Referring to FIGS. 14 to 17, there is shown an electrical control unit of a seventh embodiment of the present invention.

As will become apparent as the description proceeds, the electrical control unit of the seventh embodiment is substantially the same as the above-mentioned first embodiment except the way for fixing printed wiring board 11.

Figure 14:
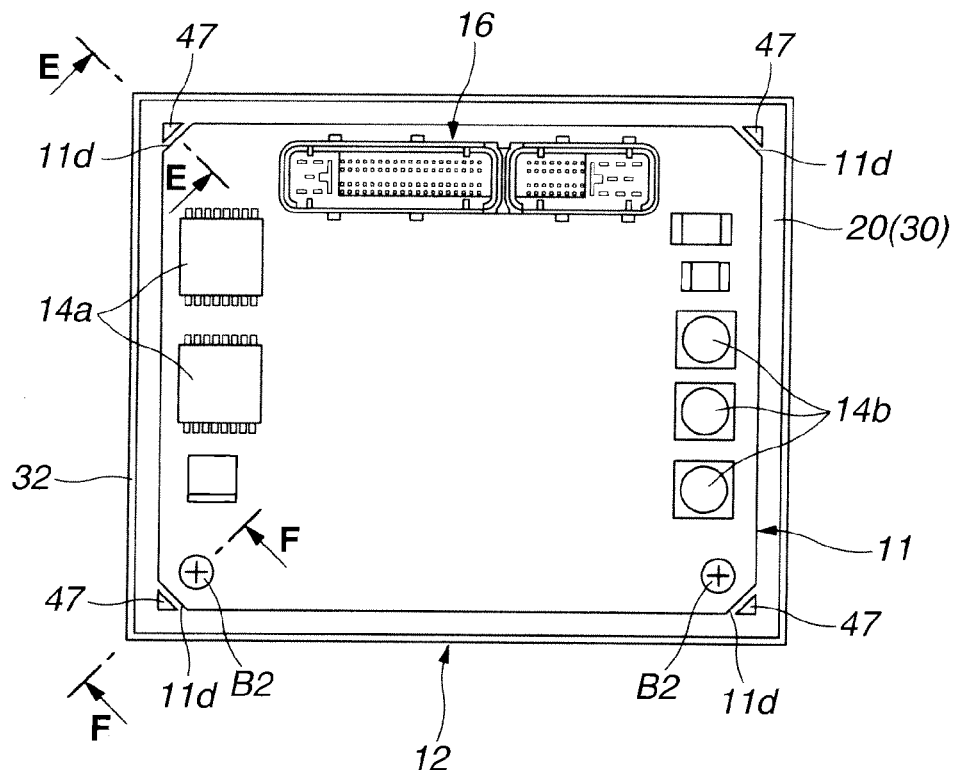
FIG. 14 is a plan view of an electrical control unit of a seventh embodiment of the present invention, with a cover removed.
Figure 16:
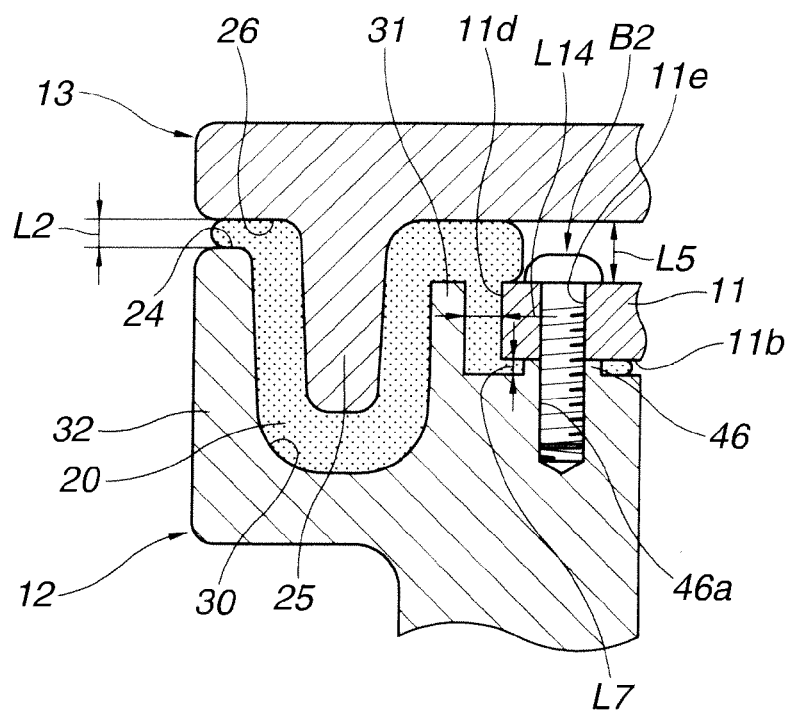
FIG. 16 is an enlarged sectional view taken along the line F-F of FIG. 14.

That is, as is seen from FIGS. 14 and 16, two connecting screws B2 are used for assuring connection between printed wiring board 11 and case 12.

Figure 17:
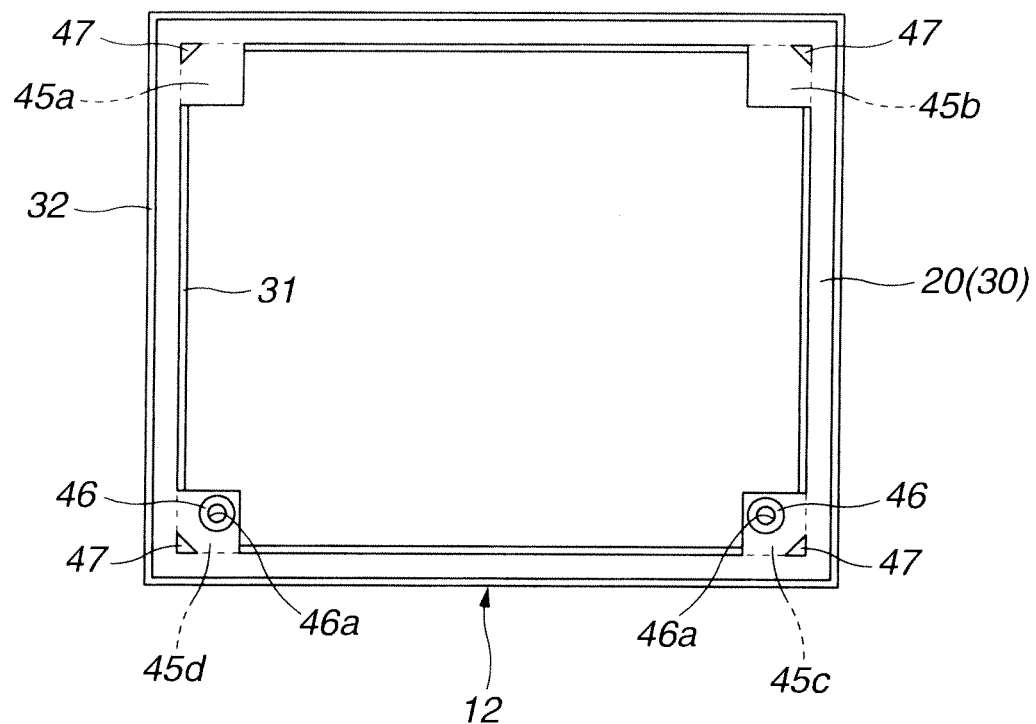
FIG. 17 is a plan view of a case of the seventh embodiment with an adhesive filled in a groove.

Referring to FIG. 17, there is shown a plan view of case 12 employed in the seventh embodiment. As is seen from this drawing, inner side wall 31 of the rectangular groove 30 of case 12 is cuts at its four corners to form adhesive holding portions 45a, 45b, 45c and 45d to which still soft adhesive 20 is to be applied. That is, before putting printed wiring board 11 onto case 12, the four adhesive holding portions 45a, 45b, 45c and 45d are applied with a still soft adhesive 20.

As is seen from FIGS. 16 and 17, two 45c and 45d of four adhesive holding portions 45a to 45d are formed with respective annular projections 46 each being formed with a threaded bore 46a. That is, as is seen from FIGS. 14 and 16, two lower corners of printed wiring board 11 (as viewed in FIG. 14) are connected to case 12 through two connecting screws B2 each being engaged with one annular projection 46 and threaded bore 46a. For this screw engagement, two lower corners of the board 11 are formed with screw openings 11e respectively. As is seen from FIG. 16, in addition to connecting screws B2, part of adhesive 20 serves to connect the board 11 to case 12.

Figure 15:
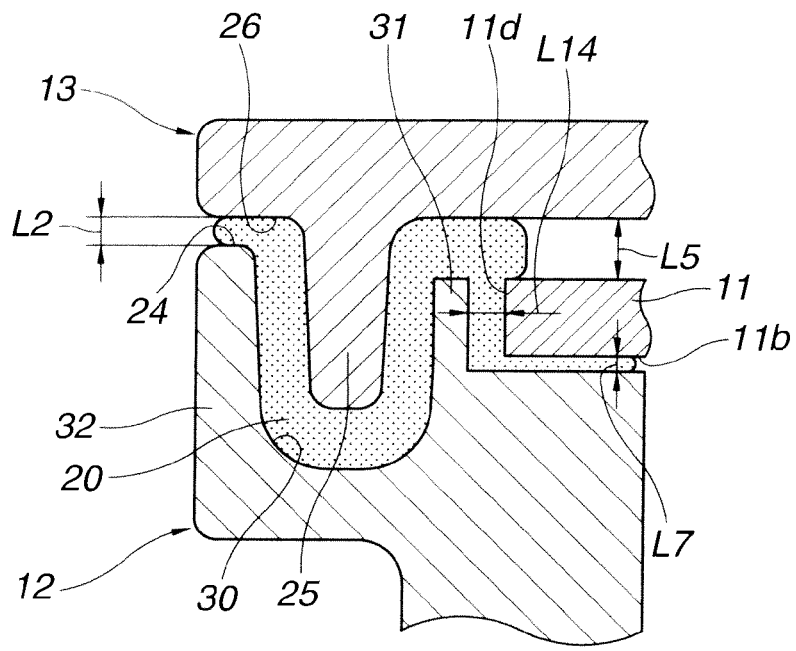
FIG. 15 is an enlarged sectional view taken along the line E-E of FIG. 14.

While, as is seen from FIGS. 15 and 17, the other two 45a and 45b of the four portions 45a to 45d have no means that corresponds to annular projections 46 and threaded bores 46a. That is, as is seen from FIGS. 14 and 15, two upper corners of printed wiring board 11 (as viewed in FIG. 14) are connected to case 2 through only adhesive 20.

As is seen from FIGS. 14 and 17, four adhesive holding portions 45a, 45b, 45c and 45d of inner side wall 31 are respectively formed with positioning projections 47 each having a triangular cross section.

As is seen from FIG. 14, with provision of such positioning projections 47, positioning of printed wiring board 11 (more specifically, tapered four corners 11d of the board 11) relative to case 12 is assuredly carried out.

In the following, steps for assembling the electrical control unit of the seventh embodiment will be described with the aid of the drawings.

First, case 12 having the above-mentioned construction is set on a given work position with its open side facing upward, and an adhesive 20 in a still soft condition is applied to rectangular groove 30 of case 20. Then, printed wiring board 11 is properly put on case 20 using positioning projections 47. Then, two connecting screws B2 are put in screw openings 11e of the board 11, engaged with threaded bores 46a of case 12 and turned in a fastening direction.

Then, cover 13 with rectangular protrusion 25 is properly put on case 12 having rectangular protrusion 25 inserted into the still soft adhesive 20 in groove 30.

Upon this, as is seen from FIGS. 15 and 16, the still soft adhesive 20 is forced to flow toward spaces "L5", "L7" and "L2", as shown. It is to be noted that a space "L14" is the space that is assuredly defined between inner side wall 31 of case 12 and the peripheral edge of printed wiring board 11 due to the work of positioning projections 47. Due to provision of such space "L14", the still soft adhesive 20 is led to adhesive holding portions 45a, 45b, 45c and 45d of case 12, so that as is seen from FIGS. 15 and 16, the peripheral edge of printed wiring board 11 is tightly bonded to both case 12 and cover 13 by the cured adhesive 20, as shown. As has been mentioned hereinabove, due to such extension of adhesive 20, heat radiation from the board 11 to the outside is effectively made. Furthermore, due to usage of connecting screws B2, connection between the board 11 and case 12 is much assured.

Of course, only a right side portion or left side portion of printed wiring board 11 (as viewed in FIG. 14) may be bolted to case 12, and positioning of the board 11 relative to case 12 may be made by other positioning way.

In the following, modifications of the present invention will be described.

In the above description, it is explained that groove 30 extends entirely along the rectangular fringe portion of case 12. However, if desired, separated grooves (30) may be provided at given portions of the rectangular fringe portion of case 12. In this case, the protrusion 25 has a shape that corresponds to that of the grooves. Of course, in this modification, case 12 can be reduced in size.

For preparing space "L7", projected seat portions 31a are used in the first to sixth embodiments and annular projections 46 are used in the seventh embodiment. However, if desired, other means may be used for preparing such space "L7".

If desired, the space "L7" may be removed. In this modification, the mechanical connection between the board 11 and case 12 is somewhat reduced. For removing space "L7", it is necessary to remove projected seat portions 31a in the first to sixth embodiments and annular projections 46 in the seventh embodiment. However, even when such projected portions 31a and 46 are removed, such space "L7" is inevitably produced due to production tolerance of printed wiring board 11 and case 12. Thus, reduction in mechanical connection between the board 11 and case 12 is minimized. Furthermore, in this modification, due to removal of the projected portions 31a and 46, case 12 is simplified in shape and thus, production cost of the electrical control unit can be reduced.

Furthermore, in the present invention, the feature regarding the shape of protrusion portion 44 of the sixth embodiment, the feature regarding the connection between printed wiring board 11 and case 12 by using two connecting screws B2 in the seventh embodiment and the feature regarding the positioning projections 47 of the seventh embodiment may be freely combined with the features of the first to fifth embodiments.

Furthermore, if desired, case 12 and cover 13, particularly at least cover 13 may be constructed of engineering plastics, such as ABS (acrylonitrile butadiene styrene), PC (polycarbonates), PA (polyamides), PBT (polybutylene telephthalate), PET (polyethylene telephthalate), Polyimides, etc. In this modification, a provisional connection of cover 13 to case 12 before the final connection due to curing of adhesive 20 may be made by employing a snap fitting construction.

In the first embodiment, elastic members 37 (see FIG. 7) are employed for resiliently press printed wiring board 11 onto projected seat portions 31a of case 12. However, if desired, in place of such elastic members 37, projections from cover 13 may be used. In this case, by adjusting the height of mount faces 27 (see FIG. 3) formed at the four corners of case 12, vertical positioning of printed wiring board 11 relative to case 12 is suitably made for bonding the board 11 to case 12 by adhesive 20.

The entire contents of Japanese Patent Application 2011-134740 filed Jun. 17, 2011 are incorporated herein by reference.

Although the invention has been described above with reference to the embodiments of the invention, the invention is not limited to such embodiments as described above. Various modifications and variations of such embodiments may be carried out by those skilled in the art, in light of the above description.

What is claimed is:

1. An electrical control unit comprising:
   a first member having a sealing groove on a first contact surface thereof;
   a second member having a protrusion on a second contact surface thereof, the protrusion being put in the groove of the first member when the second member is properly put on the first member to define therebetween a board receiving space;
   a printed wiring board received in the board receiving space, the printed wiring board having an electronic part mounted thereon;
   a sealing material received in the groove, the sealing material being pushed away from the move to a space between the first and second contact surfaces for bonding the first and second contact surfaces when the protrusion is inserted into the groove while pressing the sealing material,
   wherein the groove comprises inner and outer side walls that are connected through a rounded bottom wall, a height of the inner side wall being smaller than that of the outer side wall, and
   wherein a peripheral edge portion of the printed wiring board is put on a top of the inner side wall in a manner to serve as an extra part of the inner side wall;
   a fifth space provided between an upper surface of the printed wiring board and the second contact surface of the second member; and
   a second space provided between the top of the outer side wall of the first member and the second contact surface of the second member,
   wherein when the protrusion of the second member is inserted into the groove while pressing away the sealing material in the groove, the pushed away sealing material is forced to fill the fifth and second spaces,
   in which elastic members are resiliently put between the second contact surface of the second member and the peripheral portion of the upper surface of the printed wiring board.

2. An electrical control unit as claimed in claim 1, in which the fifth and second spaces have different heights, and in which one of the fifth and second spaces, which is higher than the other, is formed with a seal material holding space into which an excessive part of the sealing material is led when the sealing material is pushed away by the protrusion.

3. An electrical control unit as claimed in claim 1, in which the second contact surface of the second member is formed with another protrusion that projects toward the upper surface of the printed wiring board to control the amount of the sealing material led to the space that is higher than the other space.

4. An electrical control unit as claimed in claim 1, in which the printed wiring board comprises:
   a plate member made of an electrically insulated material;
   wiring patterns printed on the plate member, the wiring patters having ends exposed to an outer peripheral surface of the plate member that is entirely covered with the sealing material;
   and
   electronic parts connected to the wiring patterns and arranged in the vicinity of a peripheral edge portion the plate member.

5. An electrical control unit comprising:
a first member having a first contact surface on which a groove is provided;
a second member having a second contact surface on which a protrusion is provided, the protrusion being put in the groove of the first member when the second member is coupled with the first member to define therebetween a board receiving space;
a printed wiring board received in the board receiving space, the printed wiring board having an electronic part mounted thereon; and
an adhesive received in the groove, the adhesive in a still soft condition being pushed away from the groove to a space between the first and second contact surfaces for bonding the first and second contact surfaces when the protrusion is inserted into the adhesive in the groove,
wherein the groove includes an outer side wall and an inner side wall of which height is smaller than that of the outer side wall, and
wherein a peripheral portion of the printed wiring board is put on a top of the inner side wall in a manner to serve as an extra part of the inner side wall,
in which the pushed away adhesive fills a second space defined between a top of the outer side wall and the second contact surface, a fifth space defined between an upper surface of the peripheral portion of the printed wiring board and the second contact surface and a seventh space defined between a lower surface of the peripheral portion of the printed wiring board and a top of the inner side wall,
in which the second and fifth spaces have different heights,
in which a height of the second space is larger than that of the fifth space,
in which elastic members are resiliently put between the second contact surface of the second member and the peripheral portion of the upper surface of the printed wiring board.

6. An electrical control unit as claimed in claim 5, in which the second space is formed with a seal material holding space into which an excessive part of the still soft adhesive is led when the adhesive is pushed away by the protrusion.

7. An electrical control unit as claimed in claim 5, in which the second member has at opposed positions of the protrusion first and second portions that respectively have flat lower surfaces that respectively face the upper surface of the printed wiring board and the top of the outer side wall of the first member, a thickness of the first portion being greater than that of the second portion.

8. An electrical control unit as claimed in claim 5, in which the second contact surface of the second member is formed with another protrusion that projects toward the upper surface of the printed wiring board to control the amount of the adhesive led to the fifth space.

9. An electrical control unit as claimed in claim 5, in which the second contact surface of the second member is formed with another protrusion that projects toward the top of the outer side wall of the first member to control the amount of the adhesive led to the second space.

10. An electrical control unit as claimed in claim 5, in which. the protrusion of the second member constitutes a downwardly directed peripheral edge portion of the second member.

11. An electrical control unit as claimed in claim 5, in which the peripheral edge portion of the second member is substantially entirely covered with the pressed away adhesive.

12. An electrical control unit as claimed in claim 5, in which the printed wiring board comprises:
a plate member made of an electrically insulated material;
wiring patterns printed on the plate member, the wiring patterns having ends exposed to an outer peripheral surface of the plate member that is covered with the adhesive; and
electronic parts connected to the wiring patterns and arranged in the vicinity of a peripheral edge portion of the plate member.

13. An electrical control unit as claimed in claim 5, further comprising connecting screws by which part of the printed wiring board is connected to the first member.

* * * * *